(12) United States Patent
Masini

(10) Patent No.: US 12,302,649 B2
(45) Date of Patent: May 13, 2025

(54) INVERSION LAYER AVALANCHE PHOTODIODE WITH VERTICAL ELECTRIC FIELD

(71) Applicant: Cisco Technology, Inc., San Jose, CA (US)

(72) Inventor: Gianlorenzo Masini, Carlsbad, CA (US)

(73) Assignee: Cisco Technology, Inc., San Jose, CA (US)

( * ) Notice: Subject to any disclaimer, the term of this patent is extended or adjusted under 35 U.S.C. 154(b) by 376 days.

(21) Appl. No.: 18/054,871

(22) Filed: Nov. 11, 2022

(65) Prior Publication Data

US 2024/0162366 A1 May 16, 2024

(51) Int. Cl.
| | |
|---|---|
| *H10F 30/225* | (2025.01) |
| *H10F 71/00* | (2025.01) |
| *H10F 77/122* | (2025.01) |
| *H10F 77/14* | (2025.01) |
| *H10F 77/40* | (2025.01) |

(52) U.S. Cl.
CPC ....... *H10F 30/2255* (2025.01); *H10F 71/121* (2025.01); *H10F 77/122* (2025.01); *H10F 77/148* (2025.01); *H10F 77/413* (2025.01)

(58) Field of Classification Search
CPC .. H10F 30/223; H10F 30/225; H10F 30/2255; H10F 71/121; H10F 77/122; H10F 77/147; H10F 77/148; H10F 77/413; G02B 6/42
See application file for complete search history.

(56) References Cited

U.S. PATENT DOCUMENTS

| | | |
|---|---|---|
| 2019/0165200 A1 | 5/2019 | Masini et al. |
| 2020/0052145 A1* | 2/2020 | Novack ............... H10F 77/147 |
| 2020/0185561 A1 | 6/2020 | Huang et al. |
| 2021/0242354 A1* | 8/2021 | Wang .................. H10F 77/16 |
| 2022/0069153 A1 | 3/2022 | Li et al. |
| 2023/0155050 A1* | 5/2023 | Chowdhury .... H01L 31/022408 257/186 |

OTHER PUBLICATIONS

Nada et al., "Inverted p-down Design for High-Speed Photodetectors", Photonics 2021, 8, 39. https://doi.org/10.3390/photonics8020039.

* cited by examiner

*Primary Examiner* — John P. Dulka
(74) *Attorney, Agent, or Firm* — Patterson + Sheridan, LLP

(57) ABSTRACT

Embodiments herein describe an APD with a vertical electric field. In one embodiment, to reduce the thickness of the vertical electric field, an inversion layer at the interface between N doped silicon and an oxide is used as a cathode for the vertical electric field.

20 Claims, 5 Drawing Sheets

INVERSION LAYER AVALANCHE PHOTODIODE WITH VERTICAL ELECTRIC FIELD

TECHNICAL FIELD

Embodiments presented in this disclosure generally relate to avalanche photodiodes (APD). More specifically, embodiments disclosed herein describe APDs that use inversion layers to form vertical electrical fields.

BACKGROUND

Germanium on Silicon integrated waveguide APDs are composed of an absorption region (e.g., germanium (Ge)) and a multiplication region formed from doped silicon placed on a silicon on insulator (SOI) layer above a buried oxide (BOX). Because of this arrangement, photo carriers generated in the absorption region travel laterally throughout the width of the absorption region which, for processing reasons, cannot be made much shorter than 0.5 um.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
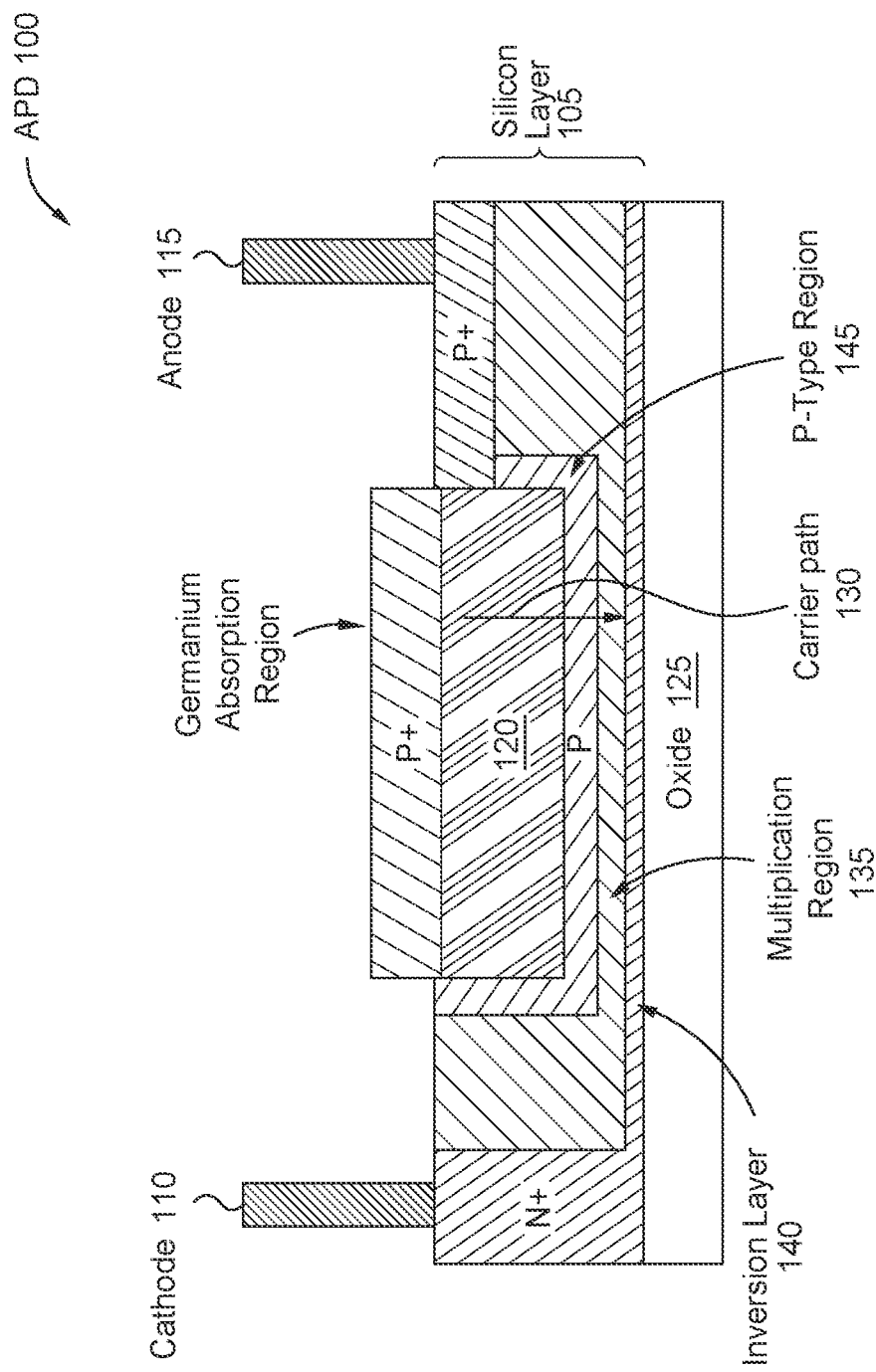
FIG. 1 illustrates an APD with a vertical electric field, according to one embodiment.

Because of the arrangement described above, APDs with lateral carrier paths suffer from speed limitation due to carrier transit time in the Germanium absorption region and a multiplication region in the silicon. One embodiment presented in this disclosure is an avalanche photodiode (APD) that includes a buried oxide layer, a silicon layer disposed on the buried oxide layer where the silicon layer includes a lightly doped region contacting the buried oxide layer where the lightly doped region forms an inversion layer at an interface between the buried oxide layer and the silicon layer, and a P doped region above the lightly doped region. The APD also includes a germanium absorption region above the P doped region, where, during operation, the APD includes a vertical electrical field in the germanium absorption region, the P doped region, the lightly doped region, and the inversion layer.

Another embodiment presented in this disclosure is an APD that includes an oxide layer, a silicon layer disposed on the oxide layer where the silicon layer includes a lightly doped region disposed on the oxide layer where the lightly doped region forms an inversion layer at an interface between the lightly doped region and the oxide layer and the inversion layer has a same dopant concentration as other portions of the lightly doped region but has a higher charge density than the other portions of the lightly doped region due to positive charges in the oxide layer, and a P doped region above the lightly doped region. The APD also includes a germanium absorption region above the P doped region, where, during operation, the APD includes a vertical electrical field where the inversion layer is a cathode for the vertical electrical field.

Another embodiment presented in this disclosure is a method for forming an APD that includes creating an inversion layer in a wafer by forming a lightly doped silicon region on a oxide layer where the inversion layer is part of the lightly doped silicon region but has a higher charge density than other portions of the lightly doped silicon region due to positive charges in the oxide layer, doping a layer of silicon above the lightly doped silicon region to form a P-type layer of silicon, and forming a germanium absorption region above the P-type layer of silicon, where, during operation, the APD includes a vertical electrical field in the germanium absorption region, the P-type layer of silicon, the lightly doped silicon region, and the inversion layer.

Example Embodiments

Embodiments herein describe an APD with a vertical electric field. Thus, instead of the photo carriers having to travel laterally through the germanium absorption region and a multiplication region in the silicon, the photo carriers travel vertically. Advantageously, the multiplication region in a vertical electric field can be much thinner than the multiplication region in a lateral electric field, thereby improving the response of the APD due to reduced carrier transit times.

In one embodiment, to reduce the thickness of the vertical electric field, an inversion layer at the interface between the silicon and an oxide (e.g., BOX) is used as a cathode for the electric field. Despite being formed from lightly doped (or intrinsic) silicon, the inversion layer behaves like a N+ doped layer due to the positive charges in the oxide. Moreover, the inversion layer is 1-2 nm thick, which is much thinner than can be achieved by current doping techniques. As a result of using the inversion layer as a thin N+ cathode, the vertical electric field can be much thinner than a lateral electric field, thereby improving the performance of the APD.

FIG. 1 illustrates an APD 100 with a vertical electric field, according to one embodiment. The APD 100 includes a cathode electrode 110 and an anode electrode 115 formed on respective N+ and P+ doped regions of a silicon layer 105. The silicon layer 105 is arranged on an oxide 125 which can be silicon dioxide or any other suitable insulator. In one embodiment, the oxide 125 and the silicon layer 105 are part of a SOI structure, where the oxide 125 is a BOX. However, the embodiments are not limited to such, and can be applied to any device that includes a crystalline silicon layer deposited on an oxide.

The silicon layer 105 also includes a lightly doped or intrinsic region which directly contacts the oxide 125 to form an thin inversion layer 140 on the oxide 125. That is, the inversion layer 140 can be formed at the interface with the oxide 125 whenever the silicon layer is lightly doped, or is intrinsic silicon. Thus, the portion of the silicon layer contacting the oxide 125 can be N− doped, P− doped or an intrinsic silicon region and the inversion layer 140 would still be created along the interface with the oxide 125. Thus, a lightly doped region is any silicon which is doped or undoped that forms the inversion layer 140 at the interface with the oxide 125. In one embodiment, the lightly doped region (whether P-type, N-type, or intrinsic silicon) has a dopant concentration that is less than 10^16 1/cm^3, where this doping concentration can approach zero in the case of intrinsic silicon.

The oxide 125 includes trapped positive charge carriers which attract the free negative charge carriers in the lightly doped region to the interface between the lightly doped region and the oxide 125, thereby forming an inversion layer 140. That is, the inversion layer 140 is formed in lightly doped silicon, but because of the positive charge carriers in the oxide, negative charge carriers accumulate to form the inversion layer 140. This inversion layer 140 functions as a N+ doped region (i.e., a layer that is doped more heavily with N-type dopants) despite being part of the lightly doped region. The inversion layer 140 is thin (e.g., less than 5 nm and often less than 2 nm or less than 1 nm). Given current limitations on doping techniques, it would be impossible to form a thin (e.g., less than 5 nm) N+ doped region at the interface with the oxide 125. However, by using the inversion layer 140, the benefits of having a N+ layer is achieved without having to actually dope this layer N+.

As shown, the inversion layer 140 contacts the N+ doped region (e.g., a cathode region) coupled to the cathode electrode 110. The N+ doped cathode region provides an electrical route to create a carrier path from the inversion layer 140 to the cathode electrode 110. Thus, the cathode electrode 110, the N+ doped cathode region, and the inversion layer 140 can be considered the cathode of the APD 100. That is, the inversion layer 140 extends the cathode of the APD 100 to a region below a germanium absorption region 120 (e.g., a Ge film). Thus, the inversion layer 140 can form the cathode of a vertical electric field where the germanium absorption region 120, or more specifically, the P+ doped region (e.g., an anode region) of the germanium absorption region 120 forms the anode of the vertical electric field. In one embodiment, P+ doped region at the top of the germanium absorption region 120 completes the junction rotation and implements a vertical electric field in combination with the inversion layer 140 (e.g., cathode).

One advantage of the APD 100 is the use of the inversion layer 140 as the cathode electrode to create a vertical electrical field during operation, thus eliminating the need for a deep and narrow implant (which may be impossible or challenging to control). The inversion layer 140 can reach significant charge density thus providing low resistance access, in a narrow vertical profile.

As light strikes the germanium absorption region 120, it create photo carriers in the region 120. The vertical electrical field causes these photo carriers to generally travel along the carrier path 130 from the region 120 to the inversion layer 140. This path 130 includes a P doped region 145 (which has a lower concentration of P-type dopants than the P+ doped regions) and a multiplication region 135 that is formed by a portion of the lightly doped region (which can be intrinsic silicon). In one embodiment, the P doped region 145 has a dopant concentration of at least 10^17 1/cm^3, which is greater than the dopant concentration in the lightly doped region. In this example, the P doped region 145 surrounds the germanium absorption region 120 in order to form a charge layer used to balance the field intensity between the germanium absorption region 120 and the underlying Si multiplication region 135.

The multiplication region 135 provides an avalanche region where the photo carriers can create additional charge carriers and amplify the signal. In one embodiment, the multiplication region 135 in the lightly doped region is at least 100 nm thick in order to provide enough energy to the accelerated photoelectrons injected from the germanium absorption region 120 for initiating the multiplication process and result in significant gain. However, in another embodiment, the lightly doped region forming the multiplication region 135 may be 80-100 nm thick. The P doped region 145 between the multiplication region 135 and the germanium absorption region 120 can range from 10-50 nm in thickness. The thickness of the germanium absorption region 120 can range from 100-500 nm. The width of the germanium absorption region 120 can range from 500-1000 nm. With the thickness described herein, the APD 100 has a low breakdown voltage and high speed due to the thin inversion layer 140, the multiplication region 135, the P doped region 145, and the germanium absorption region 120.

Doping the top of the germanium absorption region 120 P+ is optional. That is, the APD 100 can instead rely only on the P+ doped anode region under the anode electrode 115 to form the anode of the vertical electrical field. However, doping the top of the germanium absorption region 120 may be advantageous in that the positive photo carriers generated on the left side of the germanium absorption region 120 may have a shorter path to travel to reach the P+ doped region at the top of the germanium absorption region 120 than the P+ doped region under the anode electrode 115. Thus, adding the P+ doped region at the top of the germanium absorption region 120 can increase the response of the APD 100.

In another embodiment, the anode electrode 115 may be formed on top of the germanium absorption region 120. That is, instead of a lateral anode region disposed to the right of the germanium absorption region 120, the anode electrode can be formed directly on the top of the germanium absorption region 120. In that case the lateral P+ doped region to the right of the germanium absorption region 120 can be omitted.

Further, although FIG. 1 illustrates the germanium absorption region 120 extending above a top surface of the silicon layer 105 this is not a requirement. In other embodiments, the top surface of the germanium absorption region 120 may be on the same plane as (or recessed below) the top surface of the silicon layer 105.

Figure 2:
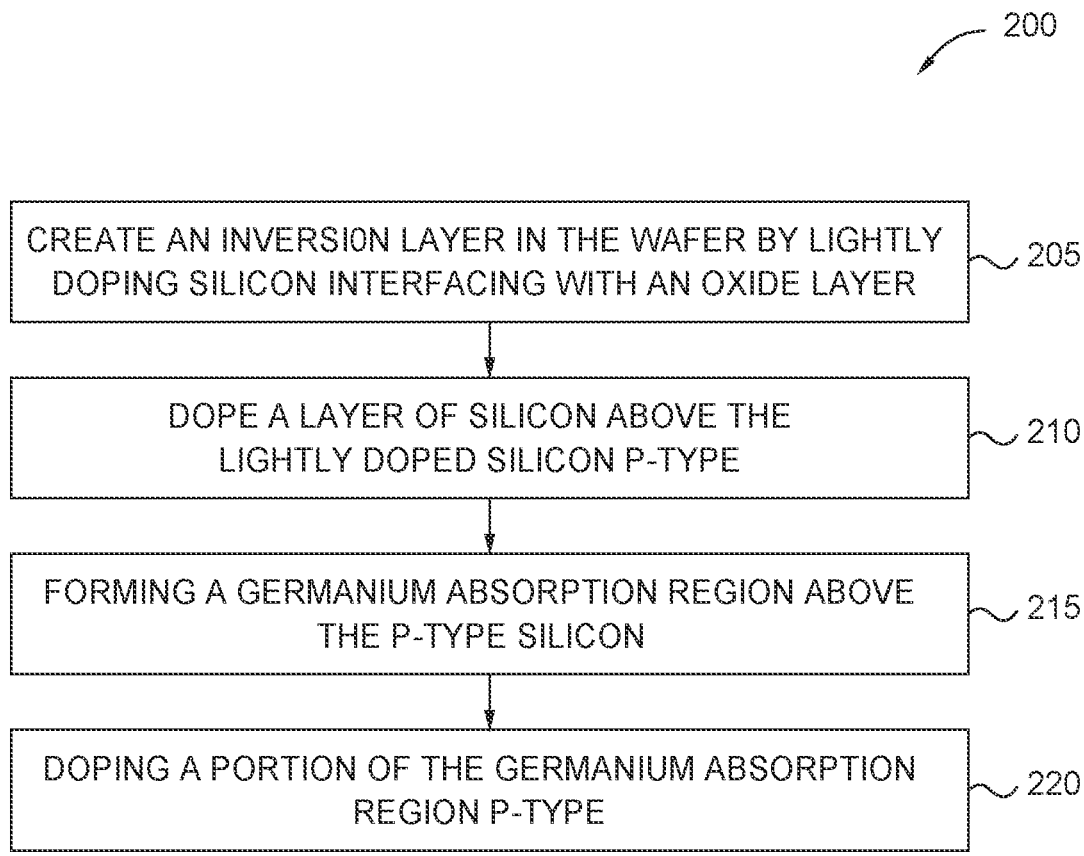
FIG. 2 is a flowchart for fabricating an APD with a vertical electric field, according to one embodiment.

FIG. 2 is a flowchart of a method 200 for fabricating an APD with a vertical electric field, according to one embodiment. For clarity, the various blocks of the method 200 are discussed in tandem with FIGS. 3A-3G which illustrate process steps for fabricating an APD.

Figure 3A:
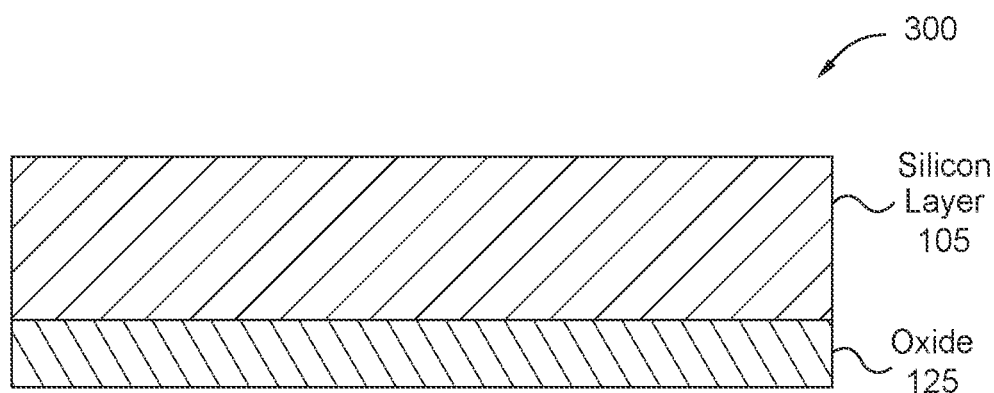
FIGS. 3A-3G illustrate process steps for fabricating an APD, according to one embodiment.

At block 205, an inversion layer is created in a wafer by lightly doping silicon interface with an oxide layer. For example, FIG. 3A illustrates a wafer 300 that includes a silicon layer 105 formed on an oxide 125. The wafer 300 may be a SOI structure where the oxide 125 is a BOX. Thus, there may be a crystalline silicon substrate below the oxide 125 in the wafer 300, which is not shown.

Figure 3B:
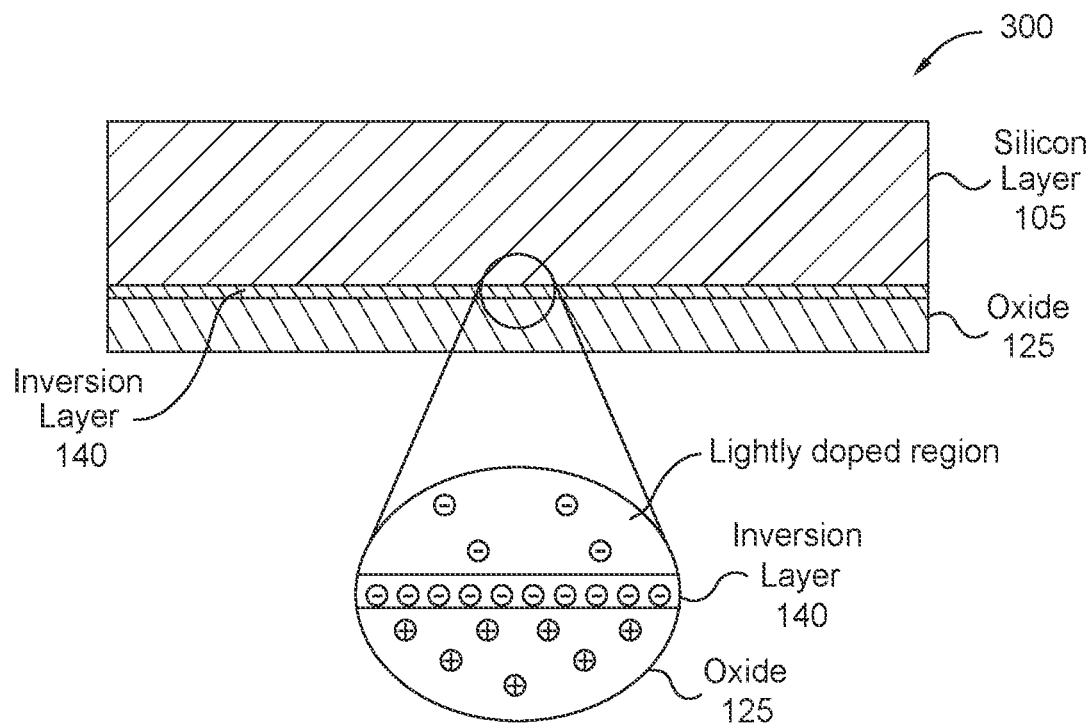

FIG. 3B illustrates a lightly doped silicon layer 105. That is, the implantation process may dope the entire silicon layer 105 on the wafer 300 N− or P−. Lightly doped silicon can also include intrinsic silicon where no dopants have intentionally been added to the silicon layer 105.

In another embodiment, the wafer 300 may be formed with a lightly doped silicon layer 105. For example, the crystal ingot used to form the wafer 300 may comprise N−, P−, or intrinsic type silicon. The ingot can then be sawed and processed to form an lightly doped silicon layer on the oxide 125, without having to perform an ion implantation.

In any case, the interface between the silicon layer 105 and the oxide 125 inherently forms the inversion layer 140. That is, the inversion layer 140 is formed from lightly doped silicon, but because of the positive charge carriers in the oxide, negative charge carriers accumulate to form the inversion layer 140. This is illustrated in more detail in the blowout in FIG. 3B where the positive charges trapped in the oxide 125 attract a high density of negative charges from the lightly doped region to form the inversion layer 140. That is, the inversion layer 140 has a higher charge density of negative charge carriers than other portions of the lightly doped region due to positive charges in the oxide 125. Thus, while the inversion layer 140 is also lightly doped (i.e., has the same dopant concentration as the remaining portion of the lightly doped region), it behaves as a heavy N doped region due to having a higher charge density of negative charge carriers.

The inversion layer 140 can contain a significant charge density thus providing low resistance access, in a narrow vertical profile (e.g., less than 5 nm and typically around 1-2 nm). The inversion layer 140 functions as a N+ doped region (i.e., a layer that is doped more heavily with N-type dopants than the lightly doped region) despite being part of the lightly doped region. In contrast, if the silicon layer 105 were doped with a higher doping concentration (regardless of whether the silicon layer 105 was P type or N type), the inversion layer would not be formed. Thus, a thin inversion layer 140 is formed everywhere lightly doped silicon (whether that is N-type, P-type or intrinsic) contacts the oxide 125.

Figure 3C:
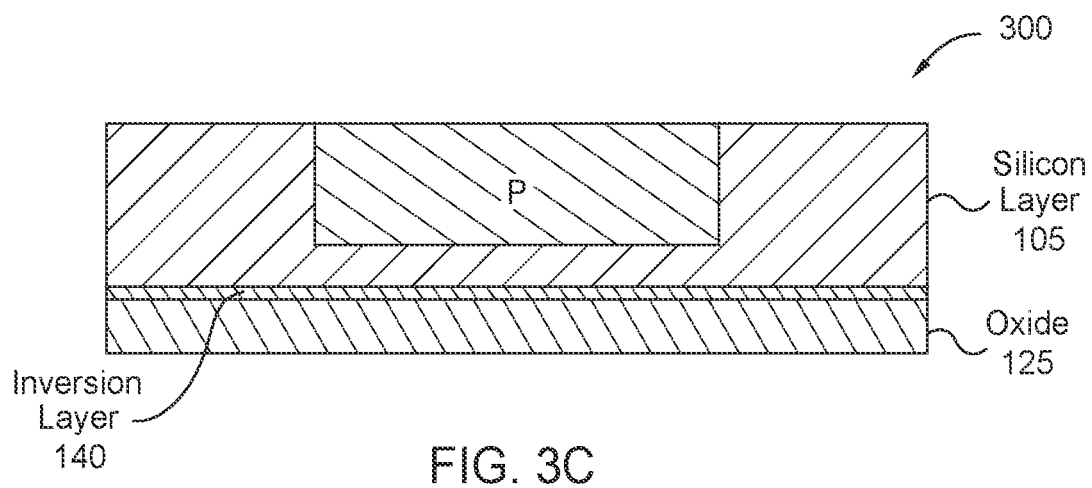

At block 210, a layer of silicon above the lightly doped silicon is doped P-type. This is shown in FIG. 3C where a P doped region is formed within the lightly doped region of the silicon layer 105. For example, the portions of the wafer 300 that should not be doped P-type can be masked off. Thus, when ion implantation is used to inject P-type dopants into the wafer 300, these dopants penetrate the silicon layer 105 in the desired location.

Further, the energy used by the ion implantation process can be controlled to ensure the heavier P doped region does not extend to the oxide 125. As such, this maintains a layer of lightly doped silicon between the P doped region and the oxide 125. As mentioned above, maintaining a layer of the lightly doped region is useful since it forms at least part of the multiplication region for the APD. In one embodiment, the ion implantation of the P-type dopants to generate the P doped region is controlled such that there is a 80-150 nm thick layer of lightly doped silicon below the P doped region and the oxide 125.

Figure 3D:
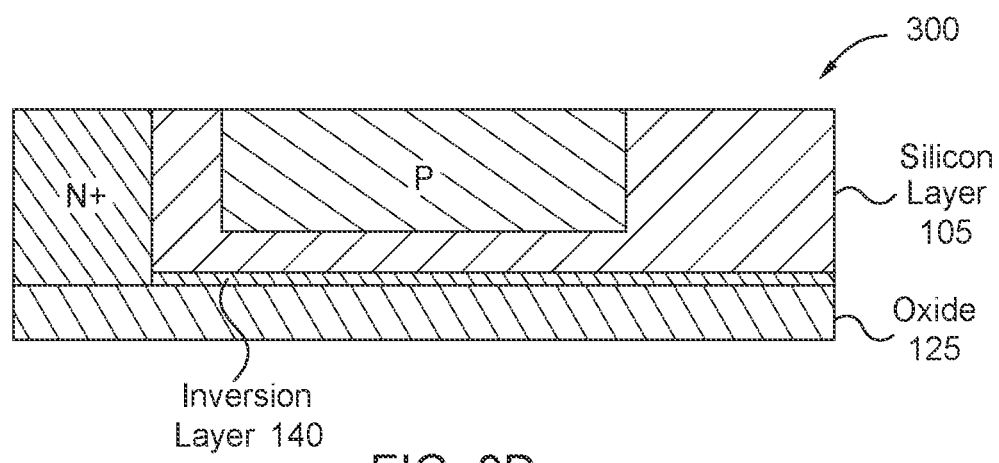

FIG. 3D illustrates a further processing step where the N+ cathode region can be formed in the silicon layer 105. For example, the other areas of the silicon layer 105 can be masked so that ion implantation can be used to convert this region from lightly doped to N+. Notably, the N+ cathode region extends to the oxide 125 so that it connects with the inversion layer 140, thereby extending the cathode to a portion of the silicon layer 105 underneath the P region.

Figure 3E:
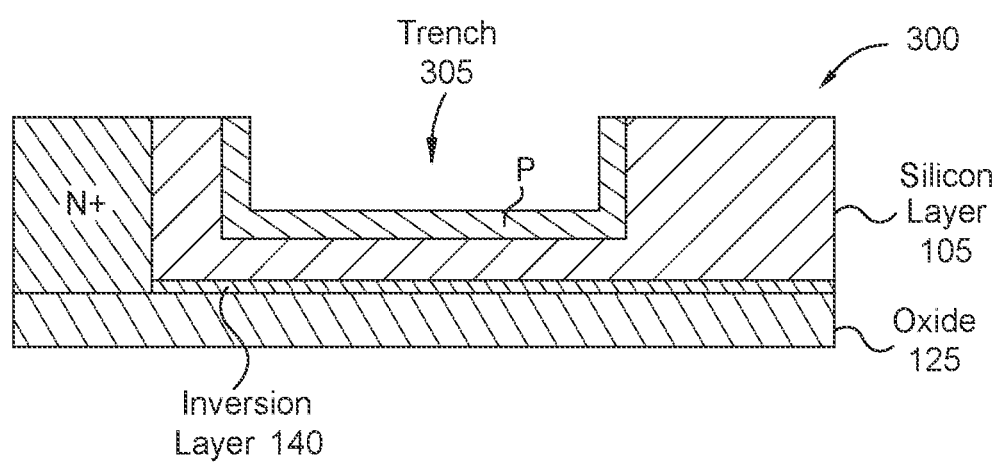

At block 215, a germanium absorption region is formed above the P doped region. FIG. 3E illustrates forming a trench 305 in the P doped region. In this embodiment, the trench 305 does not extend all the way through the P doped region so that a portion of the P doped region separates the trench 305 from the lightly doped region of the silicon layer 105. In this example, the trench 305 is surrounded on all sides by the P doped region.

Figure 3F:
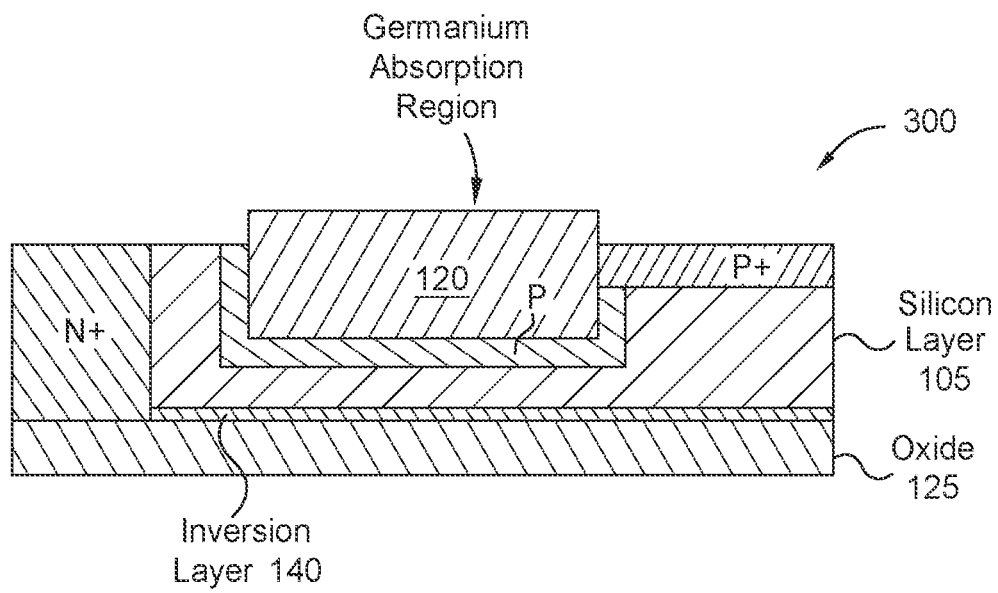

FIG. 3F illustrate forming the germanium absorption region 120 in the trench 305 formed in FIG. 3E. Germanium can be deposited or grown in the trench 305 to form the germanium absorption region 120. The present embodiments are not limited to any particular method or technique for depositing or growing the germanium in the trench.

Further, FIG. 3F illustrates that the germanium in the germanium absorption region 120 extends above a top surface of the silicon layer 105, but this is not a requirement. In other embodiments, the germanium may be deposited such that it is level with the top surface of the silicon layer 105, or is recessed relative to the top surface of the silicon layer 105.

In addition to forming the germanium absorption region 120, FIG. 3F illustrates forming the P+ doped region for the anode. In contrast to the N+ doped region which extends to the oxide 125 so that the N+ doped region can form a low electrical resistance coupling with the inversion layer 140, the P+ doped region does not extend to the oxide 125. The P+ doped anode region is separated from the oxide 125 by the lightly doped region. The P+ doped region instead directly contacts the germanium absorption region 120.

Figure 3G:
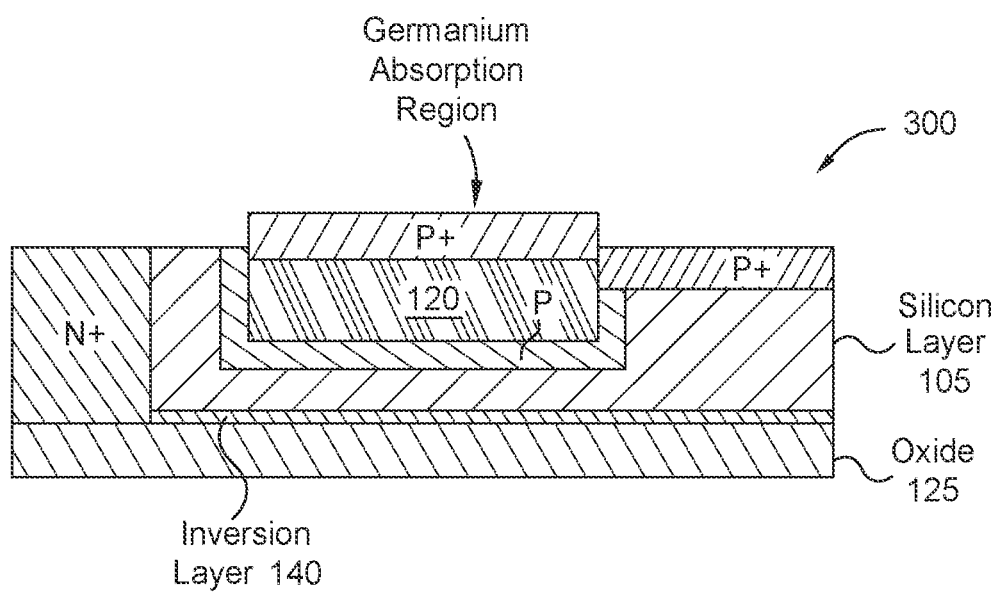

At block 220, a portion of the germanium absorption region 120 is doped P type. As shown in FIG. 3G, a top portion of the germanium absorption region 120 is doped P+. Because the P+ doped region in the germanium absorption region 120 contacts the P+ doped region in the silicon layer 105, both of the P+ doped regions can be considered as part of the anode of the APD.

While FIGS. 3F and 3G illustrate forming the P+ doped region in the germanium absorption region 120 and the P+ doped region in the silicon layer 105 in separate steps, in other embodiments, these regions may be doped P+ in the same ion implantation step. However, it is not necessary to dope the top of the germanium absorption region 120 P+.

After performing the doping in FIG. 3G, the cathode and anode electrodes (not shown) can be formed on the N+ and P+ doped regions. The resulting structure can be what is shown in FIG. 1.

However, in other embodiments, the anode electrode may be formed on the top of the germanium absorption region 120, in which case the P+ doped region to the right of the germanium absorption region 120 can be omitted.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

I claim:

1. An avalanche photodiode (APD), comprising:
   a buried oxide layer;
   a silicon layer disposed on the buried oxide layer, the silicon layer comprising:
      a lightly doped region contacting the buried oxide layer, the lightly doped region forming an inversion layer at an interface between the buried oxide layer and the silicon layer, and
      a P doped region above the lightly doped region; and
   a germanium absorption region above the P doped region, wherein, during operation, the APD includes a vertical electrical field in the germanium absorption region, the P doped region, the lightly doped region, and the inversion layer.

2. The APD of claim 1, wherein the silicon layer further comprises:
   a cathode region that is heavier doped N-type than the lightly doped region; and
   an anode region that is heavier doped P-type than the P doped region, wherein the germanium absorption region is between the cathode region and the anode region.

3. The APD of claim 2, wherein the cathode region contacts the inversion layer to provide an electrical route to create a carrier path from the vertical electrical field to a cathode electrode, and wherein the anode region contacts the germanium absorption region.

4. The APD of claim 1, wherein a portion of the lightly doped region between the germanium absorption region and the inversion layer forms a multiplication region within the vertical electrical field.

5. The APD of claim 1, further comprising:
   a heavily doped P region in the germanium absorption region, wherein the inversion layer forms a cathode of the vertical electrical field and the heavily doped P region forms an anode of the vertical electrical field.

6. The APD of claim 1, wherein at least a portion of the germanium absorption region is recessed into the silicon layer, and wherein the P doped region of the silicon layer surrounds the portion of the germanium absorption region recessed in the silicon layer.

7. The APD of claim 1, wherein a doping concentration of the lightly doped region is equal to or less than $10^{16}$ $1/cm^3$.

8. The APD of claim 1, wherein the inversion layer has a same dopant concentration as other portions of the lightly doped region but has a higher charge density of negative charge carriers than the other portions of the lightly doped region due to positive charges in the buried oxide layer.

9. The APD of claim 1, wherein a thickness of the inversion layer is less than 5 nm.

10. The APD of claim 1, wherein a thickness of the inversion layer is 2 nm or less.

11. The APD of claim 10, wherein a thickness of the lightly doped region between the P doped region and the inversion layer is between 80-150 nm.

12. The APD of claim 11, wherein a thickness of the P doped region between the germanium absorption region and the lightly doped region is 50 nm or less.

13. An avalanche photodiode (APD), comprising:
   an oxide layer;
   a silicon layer disposed on the oxide layer, the silicon layer comprising:
      a lightly doped region disposed on the oxide layer, wherein the lightly doped region forms an inversion layer at an interface between the lightly doped region and the oxide layer, wherein the inversion layer has a same dopant concentration as other portions of the lightly doped region but has a higher charge density than the other portions of the lightly doped region due to positive charges in the oxide layer, and
      a P doped region above the lightly doped region; and
   a germanium absorption region above the P doped region, wherein, during operation, the APD includes a vertical electrical field where the inversion layer is a cathode for the vertical electrical field.

14. The APD of claim 13, wherein the silicon layer further comprises:
   a cathode region that is heavier doped N-type than the lightly doped region; and
   an anode region that is heavier doped P-type than the P doped region, wherein the germanium absorption region is between the cathode region and the anode region.

15. The APD of claim 14, wherein the cathode region contacts the inversion layer to provide an electrical route to create a carrier path from the vertical electrical field to a cathode electrode.

16. The APD of claim 13, wherein a portion of the lightly doped region between the germanium absorption region and the inversion layer forms a multiplication region within the vertical electrical field, wherein the lightly doped region has a doping concentration that is less than $10^{16}$ $1/cm^3$.

17. A method for forming an avalanche photodiode (APD), the method comprising:
   creating an inversion layer in a wafer by forming a lightly doped silicon region on an oxide layer, wherein the inversion layer is part of the lightly doped silicon region but has a higher charge density than other portions of the lightly doped silicon region due to positive charges in the oxide layer;
   doping a layer of silicon above the lightly doped silicon region to form a P-type layer of silicon; and
   forming a germanium absorption region above the P-type layer of silicon, wherein, during operation, the APD includes a vertical electrical field in the germanium absorption region, the P-type layer of silicon, the lightly doped silicon region, and the inversion layer.

18. The method of claim 17, wherein forming the germanium absorption region comprises:
   forming a trench in the P-type layer of silicon; and
   forming germanium in the trench.

19. The method of claim 18, further comprising:
   doping a top portion of the germanium to form a P-type top portion in the germanium, wherein the P-type top portion has a heavier doping concentration of a P-type dopant than the P-type layer of silicon.

20. The method of claim 19, wherein the top portion of the germanium forms an anode of the vertical electrical field.

* * * * *